(12) United States Patent
Brunolli et al.

(10) Patent No.: US 9,166,565 B2
(45) Date of Patent: Oct. 20, 2015

(54) CALIBRATED OUTPUT DRIVER WITH ENHANCED RELIABILITY AND DENSITY

(71) Applicant: QUALCOMM Incorporated, San Diego, CA (US)

(72) Inventors: Michael Joseph Brunolli, Escondido, CA (US); Mark Wayland, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/056,913

(22) Filed: Oct. 17, 2013

(65) Prior Publication Data

US 2015/0109030 A1    Apr. 23, 2015

(51) Int. Cl.
- *H03K 3/01* (2006.01)
- *H03K 19/00* (2006.01)
- *H03K 19/003* (2006.01)
- *H04L 25/02* (2006.01)
- *G11C 7/10* (2006.01)

(52) U.S. Cl.
CPC .............. *H03K 3/01* (2013.01); *H03K 19/0005* (2013.01); *H03K 19/00315* (2013.01); *H04L 25/0278* (2013.01); *G11C 7/1057* (2013.01)

(58) Field of Classification Search
CPC .............. C23C 14/0021; G11C 7/1051; G11C 27/024; H03K 17/164; H03K 17/167; H03K 19/0005; H03K 19/00315; H03K 19/00361; H03K 19/00384; H03K 19/01714; H03K 19/017509; H03K 19/017545; H03K 19/084; H03K 19/09448; H04L 25/0272; H04L 25/0278

USPC ..................... 326/21–24, 30, 82–88
See application file for complete search history.

(56) References Cited

U.S. PATENT DOCUMENTS

| | | | |
|---|---|---|---|
| 3,537,891 A * | 11/1970 | Rairden | 428/433 |
| 6,091,260 A * | 7/2000 | Shamarao | 326/27 |
| 6,356,102 B1 * | 3/2002 | Klein et al. | 326/27 |
| 6,642,742 B1 | 11/2003 | Loyer | |
| 6,894,543 B2 * | 5/2005 | Ho et al. | 327/108 |
| 6,980,020 B2 * | 12/2005 | Best et al. | 326/30 |
| 7,064,575 B2 | 6/2006 | Lou | |
| 7,068,078 B2 * | 6/2006 | Yoo | 326/87 |
| 7,123,055 B1 | 10/2006 | Chong et al. | |
| 7,180,386 B2 | 2/2007 | Thompson et al. | |
| 7,227,382 B1 * | 6/2007 | Talbot et al. | 326/87 |
| 7,362,127 B2 * | 4/2008 | Tokuhiro et al. | 326/30 |
| 7,646,229 B2 | 1/2010 | Mei | |
| 7,786,753 B2 * | 8/2010 | Jeong et al. | 326/30 |
| 8,035,418 B2 | 10/2011 | Oh et al. | |
| 2005/0040845 A1 | 2/2005 | Park | |

(Continued)

OTHER PUBLICATIONS

International Search Report and Written Opinion—PCT/US2014/060373—ISA/EPO—Jan. 20, 2015.

*Primary Examiner* — Alexander H Taningco
*Assistant Examiner* — Kurtis R Bahr
(74) *Attorney, Agent, or Firm* — Haynes and Boone, LLP (57) ABSTRACT

An output driver configured to drive an output node includes a pull-down section having a plurality of legs and a pull-up section having a plurality of pull-up legs. Each leg and pull-up leg includes a data path and a calibration path. The data paths in the pull-down section are configured to conduct to ground responsive to an assertion of a complement data output signal whereas the data paths in the pull-up section are configured to conduct to a power supply node responsive to a de-assertion of the complement data output signal.

14 Claims, 4 Drawing Sheets

(56) References Cited

U.S. PATENT DOCUMENTS

| | | |
|---|---|---|
| 2008/0157811 A1 | 7/2008 | Lee et al. |
| 2009/0002091 A1 | 1/2009 | Jung |
| 2011/0242916 A1 | 10/2011 | Seol et al. |
| 2013/0162288 A1* | 6/2013 | Song ............................... 326/30 |
| 2014/0285231 A1* | 9/2014 | Suematsu et al. ............... 326/30 |

* cited by examiner

CALIBRATED OUTPUT DRIVER WITH ENHANCED RELIABILITY AND DENSITY

TECHNICAL FIELD

This application relates to output drivers, and more particularly to output drivers with dual-mode legs for impedance calibration.

BACKGROUND

The traces and interconnects that couple an integrated circuit to external devices have a characteristic impedance that should be matched by the integrated circuit's output driver. If the output driver has an output impedance that is mismatched to the characteristic impedance of the associated circuit board, undesirable effects occur such as jitter and signal reflections. Thus, it is conventional for an integrated circuit output driver to have some configurability so that it may be calibrated to the desired output impedance.

Figure 1:
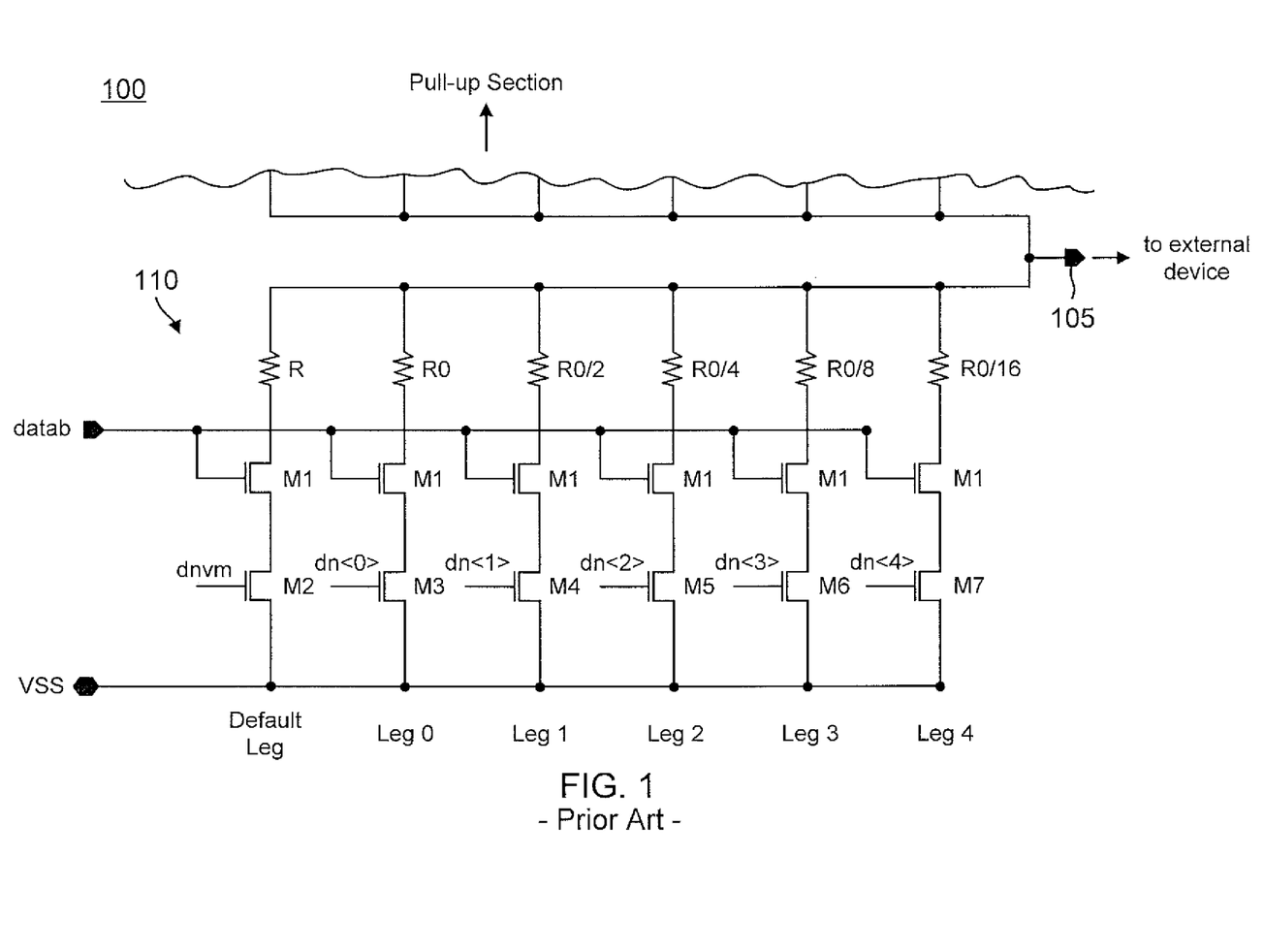
FIG. 1 is a schematic diagram of a pull-down section for a conventional calibrated output driver.

A conventional impedance-calibrated output driver 100 is shown in FIG. 1 that drives an output signal into an output pad 105. To adjust or calibrate an output impedance at pad 105, driver 100 includes a pull-down section 110 and a pull-up section (not illustrated). As suggested by the name, pull-down section 110 functions to ground pad 105 when a complement (datab) of the data output signal is asserted high. Conversely, the pull-up section functions to charge pad 105 to a power supply voltage VDD when the data output signal is high. Both the pull-up section as well as pull-down section 110 includes a number of selectable legs as well as a default leg. In pull-down section 110, each selectable leg may form a current path to ground (VSS) whereas in the pull-up section they may form a current path to a power supply node carrying the power supply voltage VDD.

The default leg in both sections is always conducting regardless of the calibration setting. Thus, the default leg in pull-down section 110 is configured to form a path to ground when the complement data signal datab driving an NMOS data transistor M1 and an enable signal dnvm driving an NMOS transistor M2 are both asserted. But the remaining legs are selectable according to calibration bits dn<0> through dn<4> corresponding to calibration transistors M3 through M7, respectively. There are thus five selectable legs in pull-down section 110 corresponding to the five calibration bits ranging from a leg 0 to a leg 4. Each leg, whether default or selectable, includes an NMOS data transistor M1 having a gate driven by the complement data output signal datab. Thus, when datab goes high, all M1 data transistors are conducting. But each selectable leg will conduct only if the corresponding calibration bit is asserted.

The current drawn by each selectable leg and the default leg depends upon the resistance of each leg's resistor. The default leg includes a resistor R whereas the resistance of the remaining selectable legs depends upon the calibration scheme. A number of calibration schemes may be used to adjust the output impedance for driver 100. For example, in a binary calibration scheme, selectable leg 0 has the largest resistance R0. Each subsequent selectable leg has one half the preceding leg's resistance. Thus, selectable leg 1 has a resistance of R0/2, selectable leg 2 has a resistance of R0/4, selectable leg 3 has a resistance of R0/8, and selectable leg 4 has a resistance of R0/16.

The pull-up section is analogous except that the default leg and the selectable legs couple to VDD instead of VSS and the NMOS transistors are replaced by PMOS transistors. The calibration bits depend upon the particular process corner used to manufacture driver 100. For example, suppose pull-down section 110 must sink a current I to provide the desired output impedance at output pad 105. If all the selectable legs are conducting such as for a slow process corner, that current I is then distributed across the selectable legs as well as the default leg. But at a fast process corner in which none of the selectable legs are conducting, transistors M1 and M2 in the default leg must then conduct the full amount of the desired current I. Resistor R in the default leg must then be of a sufficient size to reduce electromigration issues with regard to its coupling vias. The relatively large amount of current carried by the default leg at the faster process corners thus raises reliability issues from the resulting risk of electromigration. The relatively large resistor size for the default leg then carries over to the other legs. Output driver 100 is thus relatively bulky, which reduces density in the corresponding integrated circuit. This is particularly inefficient in that the resistors for the selectable legs would not even be used in the fast process corners.

Accordingly, there is a need in the art for improved drivers with greater density and improved reliability.

SUMMARY

An output driver configured to drive an output node includes a pull-down section and a pull-up section. Each section includes a corresponding plurality of dual-mode legs that each comprises a data path and a calibration path. The data paths in the pull-down section are configured to conduct a current from the output node to ground responsive to an assertion of a complement data output signal whereas the data paths in the pull-up section are configured to conduct to conduct a current from a power supply node to the output node responsive to a de-assertion of the complement data output signal. The data paths in the pull-up and pull-down sections are thus active during the respective pull-down or pull-up of the output node.

In contrast, the calibration path in each dual-mode leg in the pull-down section is configured to couple to ground only when both the complement data output signal is asserted and when a corresponding calibration bit is asserted. Similarly, the calibration path in each dual-mode leg in the pull-up section is configured to couple to the power supply node only when both the complement data output signal is de-asserted and a complement of a corresponding calibration bit is asserted. The dual-mode legs thus have a first mode of operation in which only the data path conducts. Similarly, the dual-mode legs have a second mode of operation in which both the data path and the calibration paths are conducting.

DETAILED DESCRIPTION

To provide greater density and linearity, an impedance-calibrated output driver is provided that includes a plurality of dual-mode legs in a pull-down section and a corresponding plurality of dual-mode legs in a pull-up section. Each dual-mode leg comprises a data path and a calibration path that are coupled in parallel to a corresponding resistor. The pull-up section functions to charge an output node to a power supply voltage VDD responsive to an assertion of a data output signal whereas the pull-down section functions to discharge the output pad to ground responsive to an assertion of a complement of the data output signal. In that regard, since the data output signal is binary, it is arbitrary to indicate that the output driver responds to the data output signal or its complement. For example, as the data output signal is asserted high, the pull-up section should drive the output pad high. But it is equivalent for the pull-up section to drive the output pad high in response to the complement data output signal being de-asserted (pulled low to ground). Thus, the following discussion will assume that the pull-down section and the pull-up section both respond to the complement data output signal without loss of generality.

The pull-down and pull-up sections are configured to respond to respective calibration words. For example, the calibration word for the pull-down section may be denoted as a first calibration word to distinguish it from the calibration word for the pull-up section (which may be designated as a second calibration word accordingly). Each calibration word comprises a plurality of calibration bits corresponding to the plurality of dual-mode legs in the corresponding pull-up or pull-down section. Each calibration path for a dual-mode leg is configured to conduct responsive to an assertion of the corresponding calibration bit. It may thus be seen that a dual-mode leg has a first mode of operation in which its calibration path is not conducting because the corresponding calibration bit is not asserted. In this first mode of operation, only the data path conducts responsive to the complement data output signal either being asserted (for the pull-down section) or de-asserted (for the pull-up section). In a second mode of operation, both the data path and the calibration path for a dual-mode leg conduct responsive to the corresponding calibration bit being asserted and responsive to the complement data output signal being asserted (for the pull-down section) or de-asserted (for the pull-up section).

In the pull-down section, the dual-mode legs conduct from the output pad to ground (VSS). In contrast, the dual-mode legs in the pull-up section conduct from a power supply node supplying the power supply voltage VDD to the output pad. Since each data path conducts regardless of the calibration bit values, the current is distributed across the data paths such that no one dual-mode leg needs to accommodate all or even a majority of the current in either the pull-down section or the pull-up section. In this fashion, the resistor for each leg may be relatively compact. In contrast, the resistor for the default leg in a conventional output driver such as output driver 100 discussed above must be much more robust and thus bulky. The output drivers disclosed herein are thus advantageously compact and lower the risk of electromigration. These advantageous features may be better appreciated with regard to the following example embodiments.

Example Embodiments

Figure 2:
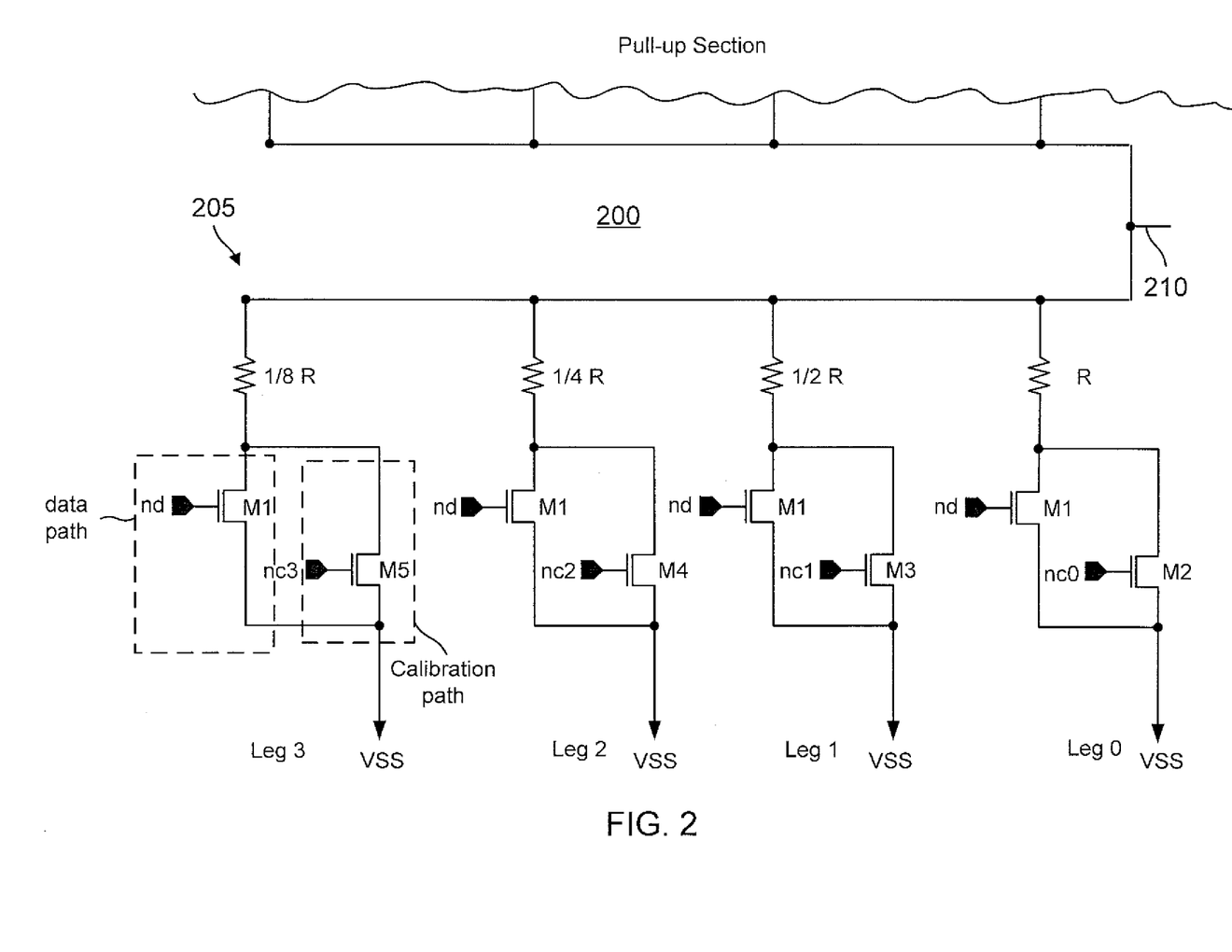
FIG. 2 is a schematic diagram of a pull-down section for a calibrated output driver in accordance with an embodiment of the disclosure.

An example driver 200 is shown in FIG. 2. Analogous to driver 100, driver 200 includes a pull-down section 205 and a pull-up section discussed further below. Pull-down section 205 includes a plurality of dual-mode legs ranging from a leg 0 to a leg 3. For brevity, the dual-mode legs disclosed herein may also be denoted simply as legs. It will be appreciated that the number of legs in alternative embodiments may be greater or less than the four used in pull-down section 205. Each leg has a data path and a calibration path arranged in parallel with the data path such as shown for leg 3. Both the data path and the calibration path couple between ground and a resistor for the corresponding leg. The data paths are configured to conduct to ground responsive to the assertion of a complement data output signal nd. Conversely, the data paths in the pull-up section discussed further below are configured to conduct to the power supply node responsive to the assertion of the data output signal (and hence a de-assertion of the complement data output signal nd). In this fashion, the data paths in the pull-up and pull-down sections conduct 180 degrees out of phase with each other such that when the data paths in pull-down section 205 are conducting, the data paths in the pull-ups section are non-conducting. Similarly, when the data paths in the pull-up section are conducting, the data paths in pull-down section 205 are non-conducting.

To provide this phasing, the data path for each leg in pull-down section 205 includes an NMOS data transistor M1 having its gate driven by the complement data output signal nd. Each leg's data transistor M1 has its source coupled to ground and a drain coupled to a first terminal for the leg's resistor. An opposing second terminal for each leg's resistor couples to an output pad 210. When the data output signal is low, complement data output signal nd is thus high so that the data paths conduct in pull-down section 205 so as to discharge output pad 210 towards ground through the resistor in each leg. The calibration path in each leg comprises an NMOS calibration transistor having its source coupled to ground and its drain coupled to the first terminal for the leg's resistor. In one embodiment, each resistor may comprise a thin-film resistor such as a titanium nitride thin-film resistor. The resistance for each leg's resistor depends upon the calibration scheme. For example, in a binary scheme the resistor in leg 0 may have a maximum resistance R. The resistor in leg 1 would then have a resistance of R/2, the resistor in leg 2 would have a resistance of R/4. Finally, leg 3 would then have a resistance of R/8. The resistors may be sized so that the current density is constant for each leg in the first mode of operation where each calibration path is switched off. The first mode may thus correspond to a fast process corner where each transistor M1 in the data path conducts a current that depends upon the leg's resistance. Note that the size of each transistor M1 depends upon the leg's current. For example, transistor M1 in leg 3 is twice the size of transistor M1 in leg 2 since leg 3 conducts twice the amount of current as compared to leg 2. Similarly, transistor M1 in leg 2 is twice the size of transistor M1 in leg 1, which in turn is twice the size of transistor M1 in leg 0.

As an alternative to using different size transistors in the data paths, the same size transistor may be used in each leg but in combination as necessary to provide the desired strengths. For example, M1 in leg 0 could be replaced with two transistors in series in the data path whereas leg 1 would have just one transistor of the same size in its data path. Leg 2 would then have two of these transistors in parallel in its data path whereas leg 3 would have four of these transistors in parallel in its data path. Regardless of whether the same size or different transistor sizes are used, the various calibration paths would be switched on depending upon the relative degree of "slowness" for the process used in the manufacture of output driver 200. For example, in an extreme slow process corner, all the data path transistors M1 are conducting a minimum amount of current as compared to what they would conduct in a fast process corner. Since each calibration path is in parallel with the data path for each leg, if the calibration paths are all conducting then the current draw on output pad 210 is maximized. The goal is that regardless of the process corner, pull-down section 205 and the pull-up section conduct a desired amount of current during their respective conductivity periods. For example, suppose that a matched output impedance for output pad 210 requires pull-down section 205 to conduct 2 mA of current while the complement data output signal nd is asserted. If the process corner is such that the collection of data paths cannot pass this amount of current, the calibration paths may be selectively turned on until the desired amount of current is reached, thereby matching the output impedance to the external circuit board traces or interconnects. The pull-up section would also be calibrated to conduct the same amount of current during the pull-up phase when the complement data output signal nd is de-asserted.

To provide an ability to switch on and off the calibration paths, each calibration path includes a switch such as an NMOS transistor. In driver 200, leg 0 includes an NMOS calibration transistor M2, leg 1 includes an NMOS calibration transistor M3, leg 2 includes an NMOS calibration transistor M4, and leg 3 includes an NMOS calibration transistor M5. Analogous to the data transistors M1, the calibration transistors may be of different size depending upon the amount of current passed in each leg as determined by its resistance. Alternatively, an appropriate collection of the same size calibration transistor may be used in each leg as also discussed with regard to the data transistors M1. The calibration transistors M2 through M5 are controlled by respective calibration bits nc0 through nc3. For example, if calibration bit nc3 is asserted, the calibration path in leg 3 conducts. The current through each leg thus has two selectable values: a default value when the calibration transistor is off and an increased value when the calibration transistor is on. But note that the goal is that pull-down section 205 sinks a desired amount of current I for all process corners as opposed to sinking an increased or decreased amount of current. In a binary calibration scheme, it may be supposed that leg 3 is configured to conduct a current such that leg 0 is configured to conduct a current $I'/8$, leg 1 is configured to conduct a current $I'/4$, and leg 2 is configured to conduct a current $I'/2$. The total current through the legs in pull-down section 205 thus equals a sum $(I'+I'/2+I'/4+I'/8)$. This sum in turn should equal the desired current, which leads to the equation $I'+I'/2+I'/4+I'/8=I$. Solving this equation provides a value to $I'$ equaling $(8/15)I$. In other words, if leg 0 is configured to conduct $(8/15)$th of the desired current I and all the remaining legs have the binary relationship discussed above, then pull-down section 205 will sink the desired current I.

Given such a desired current I goal for a pull-down section (or a pull-up section), the design of a dual-mode leg may be conducted as follows. For the fastest-expected process corner, configure the data transistor for a given leg with a size sufficient to conduct the desired fraction of the current I. For the slowest-expected process corner, the calibration transistor is configured to have a size sufficient such that it in combination with the data transistor conducts the desired fraction of I. In this fashion, the calibration word for a pull-down section (or a pull-up section) may have the appropriate number of calibration bits asserted such that the corresponding section conducts the desired amount of current for all expected process corners. As used herein, a "section" without further limitation refers generically to either a pull-up section or a pull-down section.

The calibration bits for a section's calibration word can thus be adjusted depending upon the process corner to achieve the desired output impedance. This is quite advantageous because the resistors need not be designed to carry all the necessary current. In contrast, resistor R in the default leg of conventional driver 100 must be large enough so that sufficient vias may be coupled to it to reduce electromigration. But each leg resistor in driver 200 will conduct current regardless of the calibration state. The resistors in driver 200 thus need not be so large as those discussed with regard to conventional driver 100, which substantially increases density. Moreover, the impedance differences achieved as the various calibration paths are selected are all substantially equal. Thus, linearity is enhanced as well.

In one embodiment, each data transistor may be considered to form a first means for providing a data path between the output pad and ground responsive to an assertion of a complement data output signal. Similarly, each calibration transistor may be considered to form a second means for providing a calibration path between the output pad and ground responsive to an assertion of the leg's corresponding calibration bit.

Figure 3:
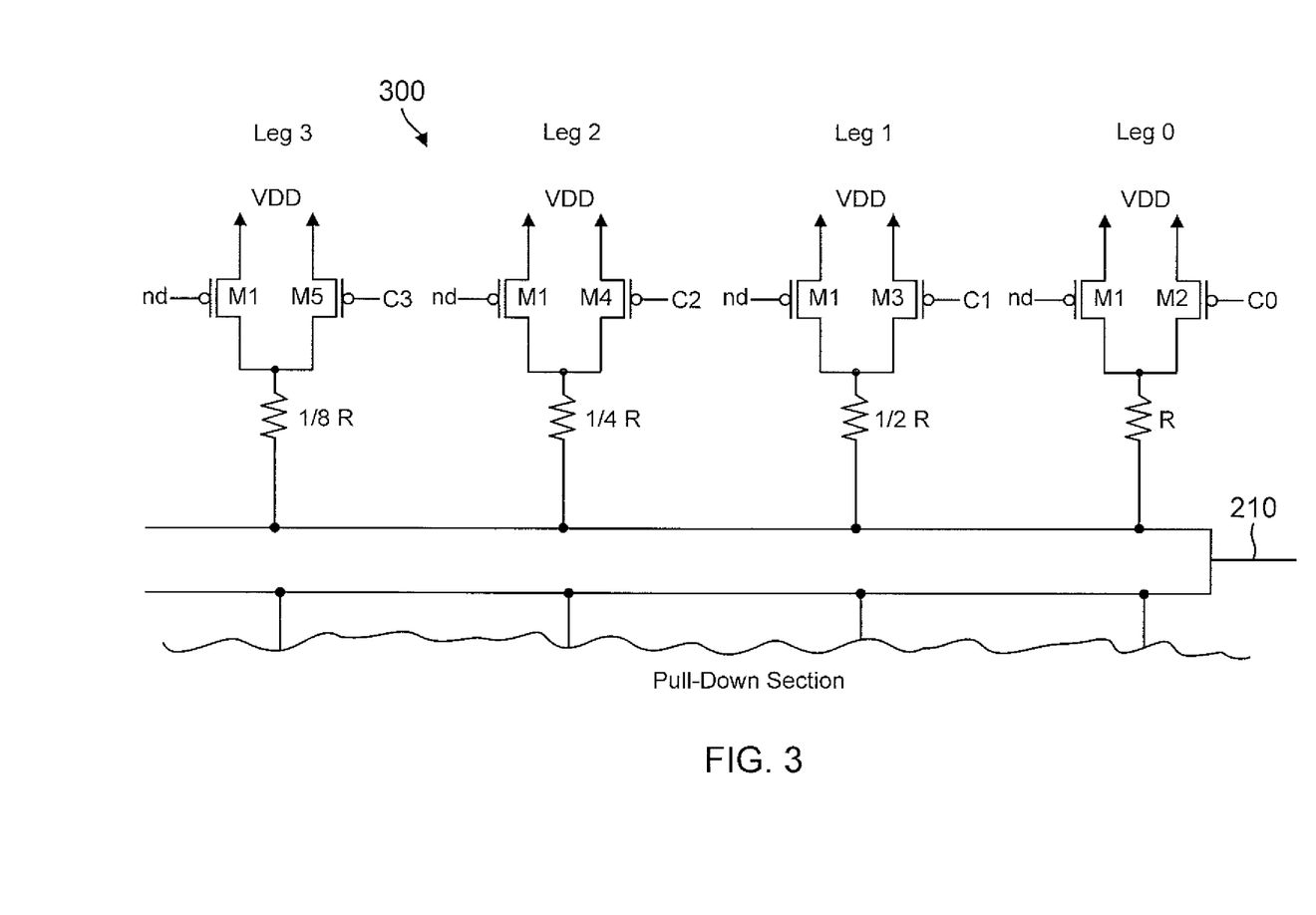
FIG. 3 is a schematic diagram of a pull-up section for a calibrated output driver in accordance with an embodiment of the disclosure.

A corresponding pull-up section 300 for driver 200 is shown in FIG. 3. Note that dual-mode leg 0 through dual-mode leg 3 in pull-up section 300 are analogous to the corresponding dual-mode legs in pull-down section 205. To better distinguish between the legs in pull-up section 300 versus those in pull-down section 205, the dual-mode legs in pull-up section 300 are denoted herein as pull-up dual-mode legs (or simply as pull-up legs). Each pull-up leg has a data path including a PMOS data transistor M1 and a calibration path with a corresponding calibration transistor. Each PMOS data transistor M1 is configured to respond to a de-assertion or grounding of the complement data output signal nd. Each data transistor M1 has a source coupled to a power supply node supplying the supply voltage VDD and a drain coupled to a first terminal for the pull-up leg's resistor. A second terminal for a pull-up leg's resistor couples to output pad 210. When the complement data output signal nd is de-asserted, each data transistor M1 will conduct, which charges output pad 210 through current conducted through the pull-up leg's resistor from the power supply node. Thus the data paths in pull-up section 300 are configured to conduct when the data output signal is asserted, which corresponds to a de-assertion of the complement data output signal nd. Each pull-up leg is configured to conduct a fraction of a desired current I analogously as discussed with regard to pull-down section 205.

The pull-up legs respond to a calibration word comprising a plurality of calibration bits corresponding to the plurality of calibration paths. The calibration path in pull-up leg 0 comprises a PMOS calibration transistor M2. Similarly, pull-up leg 1 includes a PMOS calibration transistor M3 whereas pull-up leg 2 includes a PMOS calibration transistor M4. Finally, pull-up leg 3 includes a PMOS calibration transistor M5. Each calibration transistor has its source coupled to the power supply node and a drain coupled to the first terminal for the pull-up leg's resistor. The corresponding calibration bit drives the gate of each calibration transistor such that a calibration bit C0 drives a gate of calibration transistor M2 and a calibration bit C1 drives a gate of calibration transistor M3. Similarly, a calibration bit C2 drives a gate of calibration transistor M4 whereas a calibration bit C3 drives a gate of calibration transistor M5. The calibration bits for pull-up section 300 are all active low such that they are pulled to ground when asserted. For example, if calibration bit C3 is asserted, PMOS calibration transistor M5 switches on so that leg 3 conducts in the second mode of operation. The current sourced from the power supply node by pull-up section 300 is thus analogous to the current sunk to ground by pull-down section 205. In this fashion, the calibrated output impedance does not change for output pad 210 regardless of whether pull-down section 205 or pull-up section 300 is active.

In a binary calibration scheme, the pull-up legs may be considered to range from a first pull-up leg to a last pull-up leg. Pull-up leg 0 may be denoted as the first leg whereas pull-up leg 3 would be the last leg. In this succession of binary-weighted legs, each pull-up leg subsequent to the first pull-up leg has a resistance of one-half the preceding pull-up leg. For example, the resistor in pull-up leg 2 has a resistance of ¼ R whereas pull-up leg 1's resistor has a resistance of ½ R. The pull-down section's resistors in a binary calibration scheme are configured accordingly. For example, leg 3 has a resistance of one-half that for leg 2 in pull-down section 205.

An example method of use for output driver 200 will now be discussed.

Example Method of Use

Figure 4:
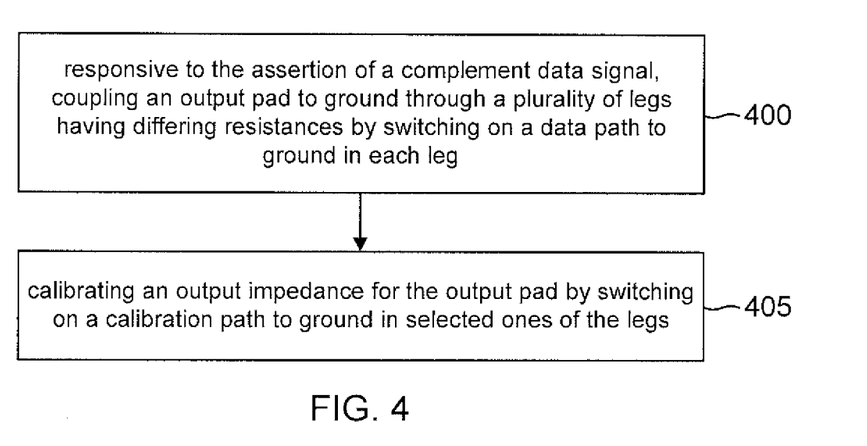
FIG. 4 is a flowchart for an example method of use for a calibrated driver in accordance with an embodiment of the disclosure.

A flowchart for an example method of use is shown in FIG. 4. The method includes an act of 400 that is responsive to the assertion of a complement data signal and comprises coupling an output pad to ground through a plurality of legs having differing resistances by switching on a data path to ground in each leg. In addition, the method includes an act 405 of calibrating an output impedance for the output pad by switching on a calibration path to ground in selected ones of the legs. The method of FIG. 4 is thus directed to the use of the pull-down section. The pull-up section method of use is analogous. In both cases, it will be appreciated that the calibration path actuation is tied to the corresponding complement data output signal state. For example, pull-down section 205 is active only when the complement output data signal nd is asserted. Thus the calibration bits that are to be asserted for the desired output impedance calibration are only asserted while the complement output data signal nd is asserted. If the calibration bit assertion were not tied to the assertion of the complement output data signal nd, the calibration paths in pull-down section 205 would be conducting while pull-up section 300 was active. Similarly, the calibration bit assertion for pull-up section 300 is also tied to the de-assertion of the complement output data signal nd to prevent pull-up section 300 from interfering with the activity of pull-down section 205 while pull-down section 205 is active.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An output driver, comprising:
a pull-down section for an integrated circuit including a plurality of dual-mode legs coupled in parallel between an output node and ground, wherein the pull-down section is configured to receive a calibration word having a plurality of calibration bits corresponding to the plurality of dual-mode legs, wherein the plurality of dual-mode legs are configured to sink a desired current from the output node to ground in response to an assertion of a complement data signal; and wherein each dual-mode leg includes:
a resistor having a first terminal coupled to the output node;
a data transistor coupled between a second terminal for the resistor and ground, the data transistor configured to conduct responsive to an assertion of the complement data signal, wherein the data transistor has a size sufficient to conduct a portion of the desired current at a fastest-expected process corner for the output driver; and
a calibration transistor coupled between the second terminal and ground, the calibration transistor configured to conduct responsive to an assertion of the leg's corresponding calibration bit, wherein the calibration transistor has a different size relative to the data transistor size so that a sum current conducted by the data transistor and the calibration transistor equals the portion of the desired current at a slowest-expected process corner for the output driver.

2. The output driver of claim 1, wherein the dual-mode legs are arranged from a first dual-mode leg to a last dual-mode leg, each dual-mode leg subsequent to the first dual-mode leg following a preceding dual-mode leg, and wherein each dual-mode leg's resistor subsequent to the first dual-mode leg has a resistance that is one-half of a resistance for the preceding dual-mode leg's resistor.

3. The output driver of claim 1, wherein each resistor is a thin-film resistor.

4. The output driver of claim 3, wherein each thin-film resistor comprises titanium nitride.

5. The output driver of claim 2, wherein the data transistor for the first dual-mode leg has a first strength, and wherein the data transistor for each dual-mode leg subsequent to the first dual-mode leg has a strength of twice the strength for the data transistor in the preceding dual-mode leg.

6. The output driver of claim 2, wherein the data transistors and the calibration transistors comprise NMOS transistors.

7. The output driver of claim 1, further comprising a pull-up section having a plurality of dual-mode pull-up legs coupled between the output node and a power supply node, wherein each dual-mode pull-up leg includes a resistor, and wherein each dual-mode pull-up leg is configured to conduct using only a data path in a first mode of operation and to conduct using the data path and a calibration path in a second mode of operation, and wherein the pull-up section is configured to receive a pull-up calibration word having a plurality of calibration bits corresponding to the plurality of dual-mode legs in the pull-up section.

8. The output driver of claim 7, wherein each dual-mode pull-up leg comprises:
a resistor having a first terminal coupled to the output node;
a data transistor coupled between a second terminal for the dual-mode pull-up leg's resistor and the power supply node and having a gate coupled to the complement data output signal; and
a calibration transistor coupled between the dual-mode pull-up leg's resistor's second terminal and the power supply node and having a gate coupled to the dual-mode pull-up leg's calibration bit.

9. The output driver of claim 8, wherein the dual-mode pull-up legs are arranged from a first dual-mode pull-up leg to a last dual-mode pull-up leg, each dual-mode pull-up leg subsequent to the first dual-mode pull-up leg having a preceding dual-mode pull-up leg, wherein the resistor for the first dual-mode pull-up leg has a first resistance, and wherein the resistor for each dual-mode pull-up leg subsequent to the first dual-mode pull-up leg has a resistance of one half the resistance for the resistor in the preceding dual-mode pull-up leg.

10. The output driver of claim 8, wherein the data transistors and the calibration transistors in the dual-mode pull-up legs comprise PMOS transistors.

11. A method, comprising:

providing a pull-down section for an integrated circuit including a plurality of legs coupled in parallel between an output node and ground, wherein the pull-down section is configured to receive a calibration word having a plurality of calibration bits corresponding to the plurality of legs, wherein the plurality of legs are configured to sink a desired current from the output node to ground responsive to an assertion of a complement data signal and wherein each dual-mode leg includes: a resistor having a first terminal coupled to the output node; a data transistor coupled between a second terminal for the resistor and ground, the data transistor configured to conduct responsive to an assertion of the complement data signal, wherein the data transistor has a size so as to conduct a portion of the desired current at a fastest-expected process corner for the integrated circuit; and a calibration transistor coupled between the second terminal and ground, the calibration transistor configured to conduct responsive to an assertion of the leg's corresponding calibration bit, wherein the calibration transistor has a different size relative to the data transistor size so that a sum current conducted by the data transistor and the calibration transistor equals the portion of the desired current at a slowest-expected process corner for the integrated circuit;

responsive to the assertion of a complement data output signal, coupling an output node to ground through a plurality of legs having differing resistances by switching on the data transistor in each leg; and calibrating an output impedance for the output node by switching on the calibration transistor in selected ones of the legs while the complement data output signal is asserted.

12. The method of claim 11, further comprising:

responsive to a de-assertion of the complement data output signal, coupling the output node to a power supply node through a plurality of pull-up legs having differing resistances by switching on a data path to the power supply node in each pull-up leg; and calibrating the output impedance for the output node by switching on a calibration path to the power supply node in selected ones of the pull-up legs while the complement data output signal is de-asserted.

13. The method of claim 12, wherein switching on the data path in each pull-up leg comprises switching on a PMOS data transistor in each pull-up leg's data path.

14. The method of claim 13, wherein switching on the calibration path in the selected ones of the pull-up legs comprises switching on a PMOS calibration transistor in each selected pull-up leg's calibration path.

* * * * *